United States Patent
Cheng

(10) Patent No.: US 8,201,031 B2
(45) Date of Patent: Jun. 12, 2012

(54) SYSTEM AND METHOD FOR REMOVING PDCCH DETECTION ERRORS IN A TELECOMMUNICATIONS NETWORK

(75) Inventor: Jung-Fu Cheng, Cary, NC (US)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 580 days.

(21) Appl. No.: 12/491,581

(22) Filed: Jun. 25, 2009

(65) Prior Publication Data

US 2010/0050059 A1     Feb. 25, 2010

Related U.S. Application Data

(60) Provisional application No. 61/090,753, filed on Aug. 21, 2008.

(51) Int. Cl.
*H03M 13/27* (2006.01)
(52) U.S. Cl. ........................ 714/701; 370/522
(58) Field of Classification Search .................. 714/701; 370/522
See application file for complete search history.

(56) References Cited

U.S. PATENT DOCUMENTS

| | | | | |
|---|---|---|---|---|
| 7,869,402 B2 * | 1/2011 | Yoon et al. | | 370/329 |
| 7,940,795 B2 * | 5/2011 | Frederiksen et al. | | 370/468 |
| 7,986,741 B2 * | 7/2011 | Tsai et al. | | 375/261 |
| 8,121,218 B2 * | 2/2012 | Kwon et al. | | 375/299 |
| 2008/0313521 A1 * | 12/2008 | Frederiksen et al. | | 714/748 |
| 2009/0041110 A1 * | 2/2009 | Malladi | | 375/240 |
| 2009/0067378 A1 * | 3/2009 | Luo et al. | | 370/329 |

OTHER PUBLICATIONS

Samsung Circular buffer rate matching for LTE. RI-072245. 3GPP TSG RAN WG1 Meeting #49. No. RI-072245, May 7, 2007.

* cited by examiner

*Primary Examiner* — Stephen Baker

(57) ABSTRACT

A system, method and node for unambiguous encoding of Physical Downlink Control Channel (PDCCH) channels in a Long Term Evolution (LTE) telecommunications system to remove detection errors. The method includes the step of modifying a size of a circular buffer by excluding at least one coded bit from the circular buffer. The circular buffer collects interleaved bits from a PDCCH payload having a plurality of bits. The PDCCH payload is encoded with a convolutional code. The bits of the PDCCH payload are then interleaved. The interleaved bits are collected into the modified circular buffer. The bits are then selected from the modified circular buffer for transmission.

25 Claims, 4 Drawing Sheets

SYSTEM AND METHOD FOR REMOVING PDCCH DETECTION ERRORS IN A TELECOMMUNICATIONS NETWORK

CROSS-REFERENCE TO RELATED APPLICATIONS

This application claims the benefit of U.S. Provisional Application No. 61/090,753, filed Aug. 21, 2008, the disclosure of which is incorporated herein by reference.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND

The present invention relates to communications networks. More particularly, and not by way of limitation, the present invention is directed to a system and method for removing Physical Downlink Control Channel (PDCCH) detection errors in a Long Term Evolution (LTE) telecommunications system. FIG. 1 illustrates a simplified block diagram of a Universal Mobile Telecommunications Systems (UMTS) network 100 that comprises a $3^{rd}$ Generation (3G) network referred to as a core network 102 and a UMTS Terrestrial Radio Access Network (UTRAN) 104. The UTRAN comprises a plurality of Radio Networks Controllers (RNCs) 106. In addition, there is a plurality of RNCs performing various roles. Each RNC is connected to a set of base stations. A base station is often called a Node-B. Each Node-B 108 is responsible for communication with one or more User Equipments (UEs) 110 within a given geographical cell. The serving RNC is responsible for routing user and signaling data between a Node-B and the core network.

In an LTE system, PDCCHs are transmitted over radio resources that are shared between several UEs. The UE is specified as having to monitor four aggregation levels, specifically, 1, 2, 4, and 8, for a UE-specific search space and two aggregation levels, specifically, 4 and 8, for a common search space.

Third Generation Partnership Project (3GPP) Technical Specification (TS) 36.213 (Version 8), Section 9.1 explains the UE procedure for determining physical downlink control channel assignment. In particular, Section 9.1.1 (PDCCH assignment procedures) discusses a search space $S_k^{(L)}$ at an aggregation level $L \in \{1, 2, 4, 8\}$ which is defined by a contiguous set of Control Channel Elements (CCEs) given by $$(Z_k^{(L)} + i) \bmod N_{CCE,k} \quad (1)$$

where $N_{CCE,k}$ is the total number of CCEs in the control region of subframe k, $Z_k^{(L)}$ defines the start of the search space, i=0, 1, ..., $M^{(L)}$. L−1 and $M^{(L)}$ is the number of PDCCHs to monitor in the given search space. Each CCE contains 36 Quadrature Phase Shift Keying (QPSK) modulation symbols. The value of M(L) is specified by Table 1 and disclosed in 3GPP TS 36.213, is shown below.

TABLE 1

$M^{(L)}$ vs. Aggregation Level L

| Type | Search space $S_k^{(L)}$ Aggregation level L | Size [in CCEs] | Number of PDCCH candidates $M^{(L)}$ |
|---|---|---|---|
| UE-specific | 1 | 6 | 6 |
|  | 2 | 12 | 6 |
|  | 4 | 8 | 2 |
|  | 8 | 16 | 2 |
| Common | 4 | 16 | 4 |
|  | 8 | 16 | 2 |

With this definition, search space for different aggregation levels may overlap with each other regardless of system bandwidth. Specifically, UE-specific search space and common search space may overlap. In addition, the search spaces for different aggregation levels may overlap. For example, Table 2 below illustrates an example of such an overlap. Table 2 illustrates the example where $N_{CCE,k}=9$, $Z_k^{(L)}=\{1, 6, 4, 0\}$ for L={1, 2, 4, 8}, respectively.

TABLE 2

| Type | Search space $S_k^{(L)}$ Aggregation Level L | PDCCH candidates |
|---|---|---|
| UE-Specific | 1 | {1}, {2}, {3}, {4}, {5}, {6} |
|  | 2 | {6, 7}, {8, 0}, {1, 2}, {3, 4}, {5, 6}, {7, 8} |
|  | 4 | {4, 5, 6, 7}, {8, 0, 1, 2} |
|  | 8 | {0, 1, 2, 3, 4, 5, 6, 7}, {8, 0, 1, 2, 3, 4, 5, 6} |
| Common | 4 | {0, 1, 2, 3}, {4, 5, 6, 7}, {8, 0, 1, 2}, {3, 4, 5, 6} |
|  | 8 | {0, 1, 2, 3, 4, 5, 6, 7}, {8, 0, 1, 2, 3, 4, 5, 6} |

A PDCCH transmission employs circular buffer based rate matching for rate 1/3 tail-biting Convolutional code. Due to repetition of coded bits and search space overlapping between different aggregation levels, multiple aggregation levels may pass the Cycle Redundancy Check (CRC) checking.

In addition, due to circular-buffer based rate matching, for a given aggregation size (2, 4 or 8), coded bits start to repeat themselves after the $1^{st}$ CCE. FIGS. 2A and 2B are simplified block diagrams illustrating CCE repetition examples in an existing telecommunications system. FIGS. 2A and 2B illustrate examples for a particular payload size (i.e., 48 bits). FIG. 2A illustrates a payload having a plurality of CCEs 200 having an aggregation size 4 with 2 repetitions. Each repetition starts at the same location in the circular buffer. FIG. 2B illustrates a payload with a plurality of CCEs 202 having an aggregation size 8. With an aggregation size of 8, there are four repetitions with each repetition starting at the same location in the circular buffer.

In general, the necessary condition to have confusing levels is shown in:

$$N \times k = 24 \times m \quad (2)$$

where N is the ambiguous payload size and m and k are both integers. Since the UE is not required to decode PDCCH with a code rate higher than 0.75, N should be no more than 54×(8−m). For example, when N=48, m=2k, k may take a value of 1, 2, or 4. In such an example, any combination of {1, 2, 4, 8} may create confusing (2 or more) aggregations levels. Since the LTE PDCCH payload contains information bits and the corresponding 16-bit CRC, the payload size is no less than 20 bits. An exhaustive list of all problematic sizes applicable to the LTE system is:

$$\{20,21,24,28,30,32,36,40,42,48,60,72,96,120\} \quad (3)$$

Due to coded bits repetition and search space overlapping between different aggregation sizes, multiple aggregation sizes may pass the CRC checking. Since the $1^{st}$ CCE of the PDCCH is linked to the uplink Acknowledgement/Negative Acknowledgement (ACK/NACK) resource for dynamic scheduling, the UE may send its ACK/NACK in a different resource, which is unknown by the Node-B (i.e., multiple ACK/NACK resources are possible). As such, there may be confusion in the Uplink (UL) ACK/NAK resource location mapped from the $1^{st}$ CCE of the corresponding PDCCH grants, when two or more PDCCH decoding candidates from different aggregation levels have different lowest CCE indices. The potentially wrong UL ACK/NAK resource location not only creates unnecessary UL interference, it also impacts downlink throughput, especially for high geometry UEs.

There have been a large number of solutions to remedy these problems. In one solution, two bits are added in each PDCCH format to indicate the aggregation size. This simple solution would allow the UE to verify the correctness of the aggregation size. However, this solution increases the overhead on the PDCCH and reduces the coverage of these important system signals.

In another existing solution, for different aggregation sizes, a different CRC mask or scrambling codes is applied. This clearly increases UE decoding complexity. In addition, the additional scrambling operations for CRC (e.g., various UE identifications, Transmit antenna selection mask, and the proposal for aggregation level specific masks) lead to a higher CRC false detection probability. Thus, this solution does not address the problems associated with detection reliability.

In another existing solution, an evolved Node B (eNodeB) attempts to decode a UE's ACK/NACK at all possible locations. The eNodeB has no knowledge of whether a UE chooses the correct aggregation level for PDCCH transmission for ambiguous PDCCH payload sizes. The eNodeB may choose to detect UL ACK/NACK for a given UE on all possible aggregation levels. However, it not only creates additional implementation complexity, but, more importantly, it cannot guarantee correct detection. First, the eNodeB has to ensure no UL ACK/NAK collision is possible. This imposes a severe scheduling restriction as different UEs should not have overlapped search space. This is very difficult, if not impossible, to satisfy in reality due to system load. Moreover, the eNodeB cannot presume specific ACK/NAK statistics for certain aggregation levels due to channel conditions, a Hybrid Automatic Repeat Request (HARQ) termination target, and imperfect power control. Finally, multiple hypotheses inevitably provide a negatively impact UL ACK/NAK detection performance. Thus, it is not practical for utilizing an eNodeB to address the aforementioned problems.

To determine the actual aggregation level for a PDCCH transmission, a UE may use various approaches. The UE may use modulated symbols to determine the energy for all possible confusing combinations of CCEs. However, this approach is very unreliable because of interference from other cells. In another approach, the PDCCH may be reencoded. The UE may decode bits to re-encode the PDCCH and determine the Signal-to-Noise Ratio (SNR) of all possible confusing combinations of CCEs. This approach is more reliable, but is very complicated. Alternately, the UE may perform a CRC check for each segment which contains an integer multiple of repetition of coded bits and an integer multiple of CCEs. There is no guarantee that each segment has the same CRC check result. Thus, complicated decision logic has to be devised. In addition, this approach inevitably increases the number of blind PDCCH decodes significantly. Thus, unless a very complicated implementation is adopted, a solution is not easily implemented. Alternatively, to bypass the above complicated implementations, the aggregation levels may be selected. For example, among all the aggregation levels with positive CRC checks, the highest or lowest aggregation level may be selected. In either case, the implementations are subject to non-negligible false alarm (of choosing the incorrect aggregation level) probability.

In another existing solution, zero padding may be applied to those PDCCH with the "troubled" payload sizes. Since, there are so many troubled payload sizes, this solution requires complicated receiver blind decoding logic.

SUMMARY

The present invention modifies the size of the circular buffer to avoid any aggregation level confusion. The present invention accomplishes this unambiguous encoding of PDCCH by excluding at least one coded bit from the circular buffer. Specifically, the excluded bit may be the last coded bit, more than one coded bit, or any coded bit in the payload.

In one aspect, the present invention is directed at a method of removing Physical Downlink Control Channel (PDCCH) detection errors in a Long Term Evolution (LTE) telecommunications system by unambiguous encoding. The method includes the step of modifying a size of a circular buffer by excluding at least one coded bit from the circular buffer. The circular buffer collects interleaved bits from a PDCCH payload having a plurality of bits. The PDCCH payload is encoded with a convolutional code. The bits of the PDCCH payload are then interleaved. The interleaved bits are collected into the modified circular buffer. The bits are then selected from the modified circular buffer for transmission.

In another aspect, the present invention is directed at a system for removing PDCCH detection errors in a LTE telecommunications system with unambiguous encoding. The system includes a transmitter for transmitting a PDCCH payload having a plurality of bits and a circular buffer for collecting interleaved bits from the PDCCH payload. The size of the circular buffer is modified by excluding at least one coded bit from the circular buffer. The PDCCH payload is encoded with a convolutional code. The plurality of bits of the PDCCH payload are interleaved and collected into the modified circular buffer. Selected bits from the modified circular buffer are then transmitted.

In still another aspect, the present invention is directed at a node for removing PDCCH detection errors in a LTE telecommunications system by transmitting the payload with unambiguous encoding. The node modifies a size of a circular buffer by excluding at least one coded bit from the circular buffer. The circular buffer collects interleaved bits from a PDCCH payload having a plurality of bits. The node encodes the PDCCH payload with a convolutional code and interleaves the plurality of bits of the PDCCH payload. The node collects the interleaved bits into the modified circular buffer. The node then selects bits from the modified circular buffer for transmission.

BRIEF DESCRIPTION OF THE DRAWINGS

In the following section, the invention will be described with reference to exemplary embodiments illustrated in the figures, in which.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The present invention is a system and method for removing Physical Downlink Control Channel (PDCCH) detection errors in a Long Term Evolution (LTE) telecommunications system. The present invention modifies the size of the circular buffer such that no aggregation level confusion may arise. The present invention accomplishes this unambiguous encoding of PDCCH by excluding one coded bit from the circular buffer. In the preferred embodiment of the present invention, the excluded bit may be the last coded bit. By reducing the circular buffer length from $3 \times N$ to $(3 \times N-1)$, there will be no payload size $N \geq 20$ that can cause PDCCH detection confusion. Since the LTE PDCCH payload contains information bits and the corresponding 16-bit CRC, the payload size is no less than 20 bits. Alternately, the number of excluded bits may be more than one. Additionally, the excluded bits may be located in different positions than the last position of the payload.

Figure 1:
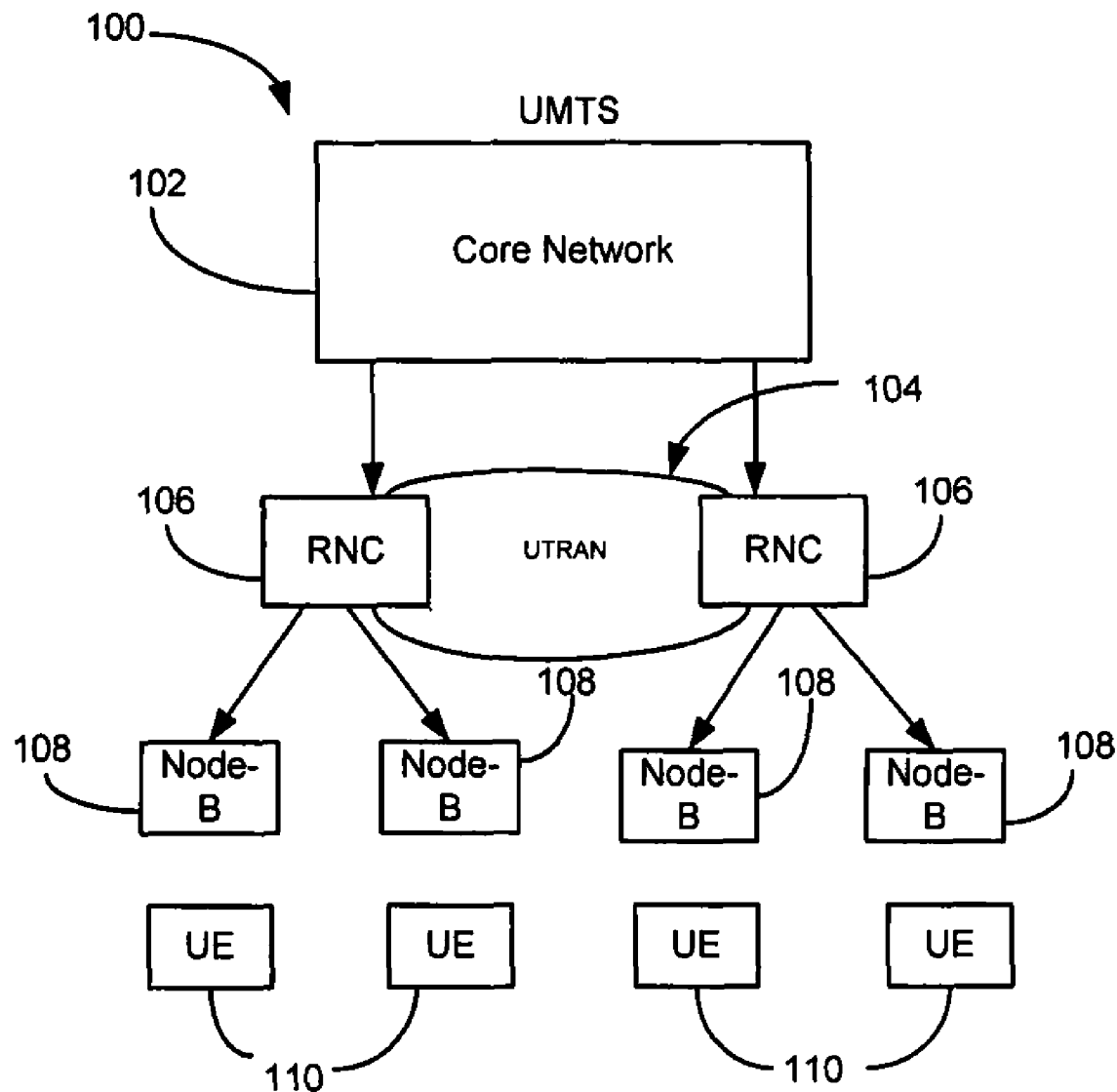
FIG. 1 (prior art) illustrates a simplified block diagram of a UMTS network.
Figure 2A:
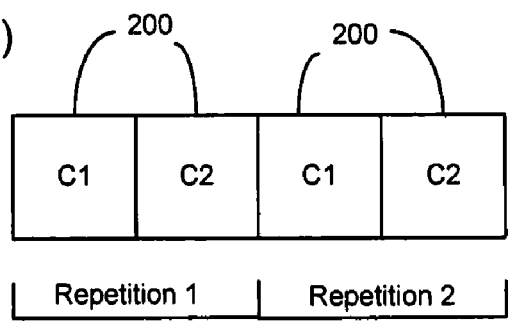
FIG. 2A (prior art) illustrates a payload having a plurality of CCEs with an aggregation size 4.
Figure 2B:
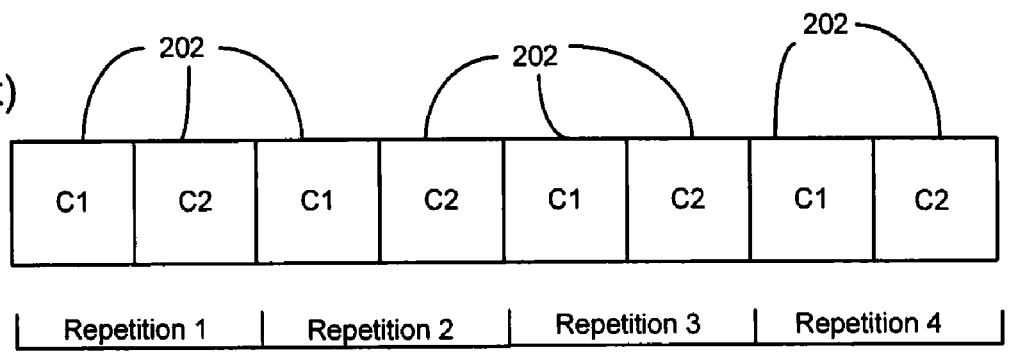
FIG. 2B (prior art) illustrates a payload with a plurality of CCEs having an aggregation size 8.
Figure 3:
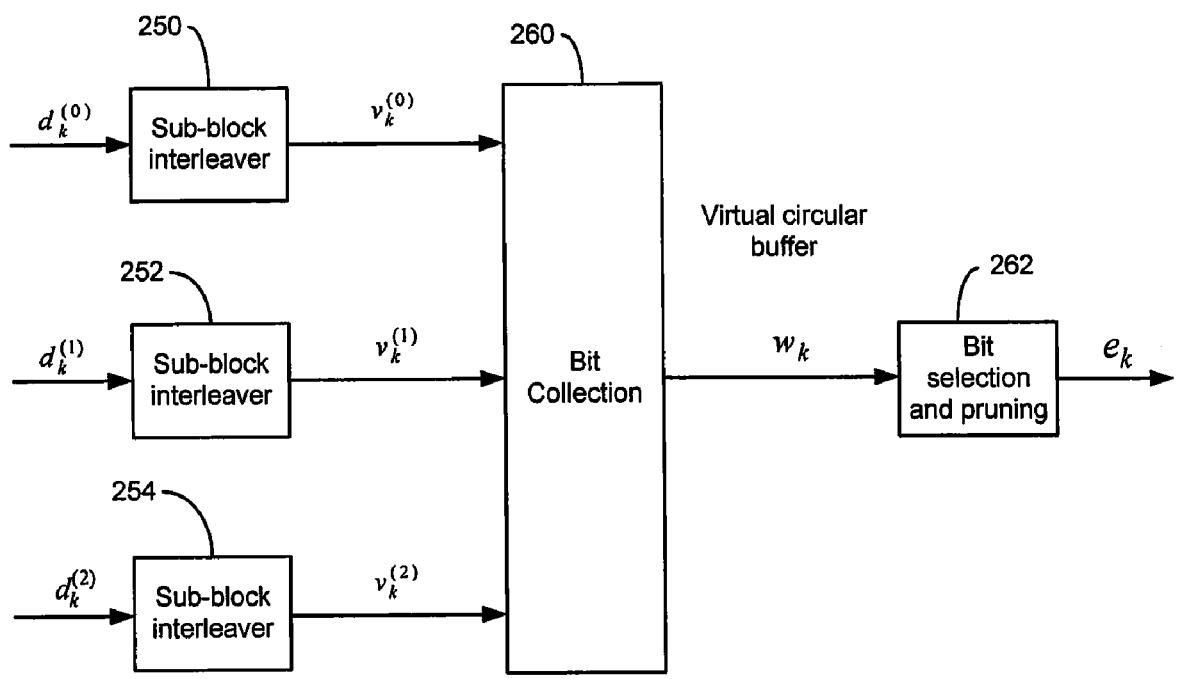
FIG. 3 is a simplified block diagram illustrating rate matching for convolutionally coded transport channels and control information.

FIG. 3 is a simplified block diagram illustrating rate matching for convolutionally coded transport channels and control information as discussed in 3GPP TS 36.212. As depicted, a plurality of sub-block interleavers 250, 252, and 254 provide an output to a bit collection 260. The payload is then processed at the bit selection and pruning 262. In particular, the PDCCH payload is first encoded by a rate 1/3 tail-biting convolutional code. Thus, with a payload size of N bits at the input of the tail-biting convolutional encoder, there are $3 \times N$ bits at the output of the encoder. As illustrated in FIG. 3, these bits are then interleaved by three sub-block interleavers. The interleaved bits are collected into a circular buffer that can be then selected for transmission.

The rate matching for convolutionally coded transport channels and control information consists of interleaving the three bit streams, $d_k^{(0)}$, $d_k^{(1)}$ and $d_k^{(2)}$ followed by the collection of bits and the generation of a circular buffer as depicted in FIG. 3. The bit stream $d_k^{(0)}$ is interleaved according to the sub-block interleaver 250 with an output sequence defined as $v_0^{(0)}, v_1^{(0)}, v_2^{(0)}, \ldots, v_{K_\Pi-1}^{(0)}$. The bit stream $d_k^{(1)}$ is interleaved according to the sub-block interleaver 252 with an output sequence defined as $v_0^{(1)}, v_1^{(1)}, v_2^{(1)}, \ldots, v_{K_\Pi-1}^{(1)}$. The bit stream $d_k^{(2)}$ is interleaved according to the sub-block interleaver 252 with an output sequence defined as $v_0^{(0)}, v_1^{(0)}, v_2^{(0)}, \ldots, v_{K_\Pi-1}^{(0)}$. The bits input to the block interleaver are denoted by $d_0^{(i)}, d_1^{(i)}, d_2^{(i)}, \ldots, d_{D-1}^{(i)}$, where D is the number of bits.

It should be noted that the convolutional encoding and rate matching algorithms as described in 3GPP TS 36.212 is generally applicable to a wide range of user data or system control information. Since the detection reliability problems arise only from the specific structure of the PDCCH, in the preferred embodiment of the present invention, minimal changes are made in the case of PDCCH payloads only. In a first embodiment of the present invention, the operations in Section 5.1.4.2.2 (Bit collection, selection and transmission) of the 3GPP TS 36.212 are modified to the following. The circular buffer of length $K_w = 3K_\Pi$ is generated as follows:

$$w_k = v_k^{(0)} \text{ for } k=0, \ldots, K_\Pi-1$$

$$w_{K_\Pi+k} = v_k^{(1)} \text{ for } k=0, \ldots, K_\Pi-1$$

$$w_{2K_\Pi+k} = v_k^{(2)} \text{ for } k=0, \ldots, K_\Pi-1$$

If the payload is for PDCCH, the length of the circular buffer is reduced by one: $K_w = 3K_\Pi - 1$.

Denoting by E the rate matching output sequence length, the rate matching output bit sequence is $e_k$, $k=0, 1, \ldots, E-1$.

```
Set k = 0 and j = 0
while { k < E }
    if w_{jmodK_w} ≠ < NULL >
        e_k = w_{jmodK_w}
        k = k +1
    end if
    j = j +1
end while
```

In a second embodiment of the present invention, the operations discussed above for the first embodiment may be further modified. In particular, the circular buffer length is decided as follows:

$$K_w = 3K_\Pi - 1, \text{ for PDCCH payload, and}$$

$$K_w = 3K_\Pi, \text{ otherwise.}$$

The circular buffer is generated as follows:

$$w_k = v_k^{(0)} \text{ for } k=0, \ldots, K_\Pi-1$$

$$w_{K_\Pi+k} = v_k^{(1)} \text{ for } k=0, \ldots, K_\Pi-1$$

$$w_{2K_\Pi+k} = v_k^{(2)} \text{ for } k=0, \ldots, K_\Pi-2, \text{ for PDCCH payload, and for } k=0, \ldots, K_\Pi-1, \text{ otherwise.}$$

Denoting by E the rate matching output sequence length, the rate matching output bit sequence is $e_k$, $k=0, 1, \ldots, E-1$.

```
Set k = 0 and j = 0
while { k < E }
    if w_{jmodK_w} ≠ < NULL >
        e_k = w_{jmodK_w}
        k = k +1
    end if
    j = j +1
end while
```

In a third embodiment of the present invention, the size of the circular buffer for all LTE convolutional coded signals is modified. Specifically, the operations in Section 5.1.4.2.2 (Bit collection, selection and transmission) of the 3GPP TS 36.212 are modified to the following. The circular buffer of length $K_w=3K_\Pi-1$ is generated as follows:

$$w_k=v_k^{(0)} \text{ for } k=0,\ldots,K_\Pi-1$$

$$w_{K_\Pi+k}=v_k^{(1)} \text{ for } k=0,\ldots,K_\Pi-1$$

$$w_{2K_\Pi+k}=v_k^{(2)} \text{ for } k=0,\ldots,K_\Pi-2$$

Denoting by E the rate matching output sequence length, the rate matching output bit sequence is $e_k$, k=0, 1, . . . , E−1.

```
Set k = 0 and j = 0
while { k < E }
    if w_{jmodK_w} ≠ <NULL>
        e_k = w_{jmodK_w}
        k = k +1
    end if
    j = j +1
end while
```

Figure 4:
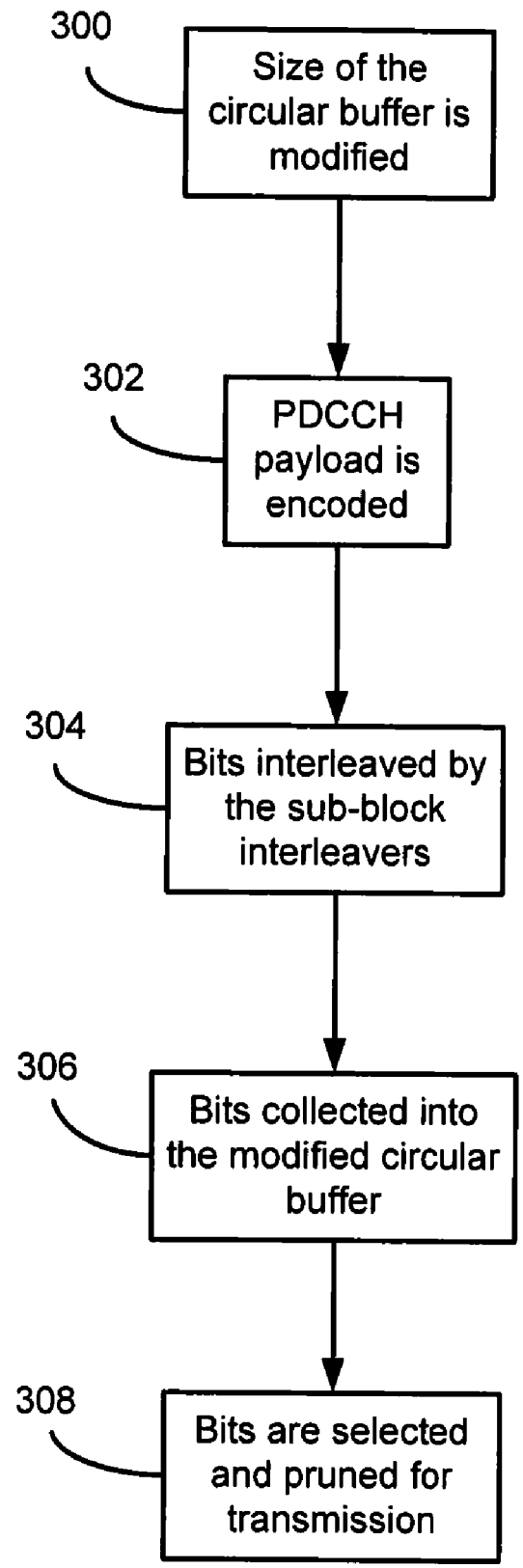
FIG. 4 is a flow chart illustrating the steps of removing PDCCH detection errors in a LTE telecommunications system.

FIG. 4 is a flow chart illustrating the steps of removing PDCCH detection errors in a LTE telecommunications system according to the teachings of the present invention. With reference to FIGS. 1-4, the steps of the present invention will now be explained. The method begins in step 300 where the size of the circular buffer is modified such that no aggregation level confusion may arise. This may be accomplished by excluding one coded bit from the circular buffer. The excluded bit may be the last coded bit, more than one excluded bit, or another coded bit of the payload. In one embodiment, the circular buffer of only PDCCH payloads is modified as discussed above. In another embodiment, the circular buffer length is decided by:

$$K_w=3K_\Pi-1, \text{ for PDCCH payload, and}$$

$$K_w=3K_\Pi, \text{ otherwise.}$$

In another embodiment, the size of the circular buffer for all LTE convolution coded signals is modified.

Next, in step 302, the PDCCH payload is encoded by a rate 1/3 tail-biting convolutional code. In step 304, the bits are then interleaved by the sub-block interleavers 250, 252, and 254. Next, in step 306, the bits are collected at bit collection 260 into the modified circular buffer. In step 308, the bits are selected and pruned in 262 for transmission.

The present invention provides several distinct advantages over existing systems. The invention provides a universal solution to the PDCCH detection reliability problem. In addition, the present invention provides a relatively simple method and system of detecting and removing PDCCH detection errors without unduly adding complexity to the telecommunications system.

As will be recognized by those skilled in the art, the innovative concepts described in the present application can be modified and varied over a wide range of applications. Accordingly, the scope of patented subject matter should not be limited to any of the specific exemplary teachings discussed above, but is instead defined by the following claims.

The invention claimed is:

1. A method of unambiguous encoding of a Physical Downlink Control Channel (PDCCH) in a Long Term Evolution (LTE) telecommunications system, the method comprising the steps of:
    modifying a size of a circular buffer by excluding at least one coded bit from the circular buffer, the circular buffer collecting interleaved bits from a PDCCH payload having a plurality of bits;
    encoding the PDCCH payload with a channel code;
    interleaving the plurality of bits of the PDCCH payload;
    collecting interleaved bits into the modified circular buffer; and
    selecting bits from the modified circular buffer for transmission.

2. The method according to claim 1 wherein the step of modifying a size of the circular buffer includes excluding a last coded bit of the circular buffer.

3. The method according to claim 1 wherein the step of modifying a size of the circular buffer includes excluding a plurality of coded bits from the circular buffer.

4. The method according to claim 1 wherein the step of modifying a size of the circular buffer includes excluding a coded bit from any position of the circular buffer.

5. The method according to claim 1 wherein the step of modifying a size of the circular buffer includes modifying a circular buffer solely associated with PDCCH payloads.

6. The method according to claim 1 wherein the step of modifying a size of the circular buffer includes modifying the circular buffer length by:

$$K_w=3K_\Pi-1, \text{ for PDCCH payload, and}$$

$$K_w=3K_\Pi, \text{ otherwise.}$$

7. The method according to claim 1 wherein the size of the circular buffer for all LTE convolution coded signals is modified.

8. The method according to claim 1 wherein the channel code is a rate 1/3 tail-biting convolutional code.

9. A system for transmitting an unambiguously encoded Physical Downlink Control Channel (PDCCH) channel in a Long Term Evolution (LTE) telecommunications system, the system comprising:
    a transmitter for transmitting a PDCCH payload having a plurality of bits;
    a circular buffer for collecting interleaved bits from the PDCCH payload;
    means for modifying a size of the circular buffer by excluding at least one coded bit from the circular buffer;
    means for encoding the PDCCH payload with a channel code;
    means for interleaving the plurality of bits of the PDCCH payload;
    means for collecting interleaved bits into the modified circular buffer; and
    means for selecting bits from the modified circular buffer for transmission.

10. The system according to claim 9 wherein the means for modifying a size of the circular buffer includes means for excluding a last coded bit of the circular buffer.

11. The system according to claim 9 wherein the means for modifying a size of the circular buffer includes means for excluding a plurality of coded bits from the circular buffer.

12. The system according to claim 9 wherein the means for modifying a size of the circular buffer includes means for excluding a coded bit from any position of the circular buffer.

13. The system according to claim 9 wherein the means for modifying a size of the circular buffer includes means for modifying a circular buffer solely associated with PDCCH payloads.

14. The system according to claim 9 wherein the means for modifying a size of the circular buffer includes means for modifying the circular buffer length by:

$K_w = 3K_\Pi - 1$, for PDCCH payload, and $K_w = 3K_\Pi$, otherwise.

15. The system according to claim 9 wherein the size of the circular buffer for all LTE convolution coded signals is modified.

16. The system according to claim 9 wherein the means for interleaving the plurality of bits of the PDCCH payload are a plurality of sub-block interleavers.

17. The system according to claim 9 wherein the channel code is a rate 1/3 tail-biting convolutional code.

18. A node for transmitting an unambiguously encoded Physical Downlink Control Channel (PDCCH) channel in a Long Term Evolution (LTE) telecommunications system, the node comprising:
  means for modifying a size of a circular buffer by excluding at least one coded bit from the circular buffer, the circular buffer collecting interleaved bits from a PDCCH payload having a plurality of bits;
  means for encoding the PDCCH payload with a channel code;
  means for interleaving the plurality of bits of the PDCCH payload;
  means for collecting interleaved bits into the modified circular buffer; and
  means for selecting bits from the modified circular buffer for transmission.

19. The node according to claim 18 wherein the means for modifying a size of the circular buffer includes means for excluding a last coded bit of the circular buffer.

20. The node according to claim 18 wherein the means for modifying a size of the circular buffer includes means for excluding a plurality of coded bits from the circular buffer.

21. The node according to claim 18 wherein the means for modifying a size of the circular buffer includes means for excluding a coded bit from any position of the circular buffer.

22. The node according to claim 18 wherein the means for modifying a size of the circular buffer includes means for modifying a circular buffer solely associated with PDCCH payloads.

23. The node according to claim 18 wherein the means for modifying a size of the circular buffer includes means for modifying the circular buffer length by:

$K_w = 3K_\Pi - 1$, for PDCCH payload, and $K_w = 3K_\Pi$, otherwise.

24. The node according to claim 18 wherein the size of the circular buffer for all LTE convolution coded signals is modified.

25. The node according to claim 18 wherein the channel code is a rate 1/3 tail-biting convolutional code.

* * * * *

UNITED STATES PATENT AND TRADEMARK OFFICE
CERTIFICATE OF CORRECTION

PATENT NO. : 8,201,031 B2
APPLICATION NO. : 12/491581
DATED : June 12, 2012
INVENTOR(S) : Cheng Page 1 of 1

It is certified that error appears in the above-identified patent and that said Letters Patent is hereby corrected as shown below:

In Column 1, Line 66, delete "M(L)" and insert -- $M^{(L)}$ --, therefor.

In Column 5, Lines 64-65, delete " $v_0^{(0)}, v_1^{(0)}, v_2^{(0)}, \ldots, v_{k_n-1}^{(0)}$ " and insert -- $v_0^{(2)}, v_1^{(2)}, v_2^{(2)}, \ldots, v_{K_n-1}^{(2)}$ --, therefor.

Signed and Sealed this
Eleventh Day of September, 2012

David J. Kappos
*Director of the United States Patent and Trademark Office*